US012680156B2

(12) United States Patent
Nomoto

(10) Patent No.: US 12,680,156 B2
(45) Date of Patent: Jul. 14, 2026

(54) COOLING DEVICE, SEMICONDUCTOR MANUFACTURING APPARATUS, AND SEMICONDUCTOR MANUFACTURING METHOD

(71) Applicant: CANON KABUSHIKI KAISHA, Tokyo (JP)

(72) Inventor: Makoto Nomoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1455 days.

(21) Appl. No.: 16/909,355

(22) Filed: Jun. 23, 2020

(65) Prior Publication Data

US 2020/0318230 A1 Oct. 8, 2020

Related U.S. Application Data

(63) Continuation of application No. PCT/JP2018/043987, filed on Nov. 29, 2018.

(30) Foreign Application Priority Data

Dec. 26, 2017 (JP) ................................. 2017-250107

(51) Int. Cl.
*C23C 14/54* (2006.01)
*C23C 16/46* (2006.01)
(Continued)

(52) U.S. Cl.
CPC .......... *C23C 14/541* (2013.01); *C23C 16/463* (2013.01); *H10P 72/70* (2026.01)

(58) Field of Classification Search
None
See application file for complete search history.

(56) References Cited

U.S. PATENT DOCUMENTS 8,610,089 B2 12/2013 Donders
10,591,194 B2 * 3/2020 Sasaki ..................... F25B 43/02
(Continued)

FOREIGN PATENT DOCUMENTS

EP 3355004 A2 8/2018
JP 2004349551 A 12/2004
(Continued)

OTHER PUBLICATIONS

Extended European Search Report issued in European Appln. No. 18897285.5 mailed Jun. 24, 2021.
(Continued)

*Primary Examiner* — Jeffrie R Lund
*Assistant Examiner* — Tiffany Z Nuckols
(74) *Attorney, Agent, or Firm* — ROSSI, KIMMS & McDOWELL LLP

(57) ABSTRACT

A cooling device includes a tank, a first path configured to circulate a liquid-phase refrigerant by a pump so as to extract the liquid-phase refrigerant from the tank, cool the liquid-phase refrigerant, and return the liquid-phase refrigerant to the tank, and a second path branched from the first path. The second path includes a heater configured to heat the liquid-phase refrigerant supplied from the first path, a throttle configured to decrease a pressure of the refrigerant heated by the heater, and a vaporizer configured to vaporize, by heat from a cooling target, at least part of the refrigerant having passed through the throttle, and the refrigerant having passed through the throttle being returned to the tank.

18 Claims, 8 Drawing Sheets

(51) Int. Cl.
    H01L 21/683     (2006.01)
    H10P 72/70     (2026.01)

(56)         References Cited

U.S. PATENT DOCUMENTS

| | | | | |
|---|---|---|---|---|
| 2006/0219360 | A1* | 10/2006 | Iwasaki | H01L 21/67248 |
| | | | | 156/345.52 |
| 2007/0263356 | A1 | 11/2007 | Weber | |
| 2008/0073563 | A1 | 3/2008 | Novak | |
| 2008/0302505 | A1 | 12/2008 | Kato | |
| 2010/0005815 | A1* | 1/2010 | Yanagida | F25B 45/00 |
| | | | | 62/149 |
| 2010/0126666 | A1* | 5/2010 | Tandou | H01L 21/67109 |
| | | | | 156/345.27 |
| 2013/0219934 | A1* | 8/2013 | Sasaki | H01L 21/67109 |
| | | | | 62/304 |
| 2013/0240144 | A1* | 9/2013 | Buchberger | G05D 23/1393 |
| | | | | 165/100 |
| 2015/0300210 | A1* | 10/2015 | Smague | F01K 13/02 |
| | | | | 60/692 |
| 2017/0092471 | A1* | 3/2017 | Wakai | H01J 37/32697 |
| 2018/0269090 | A1* | 9/2018 | Kobayashi | H01L 21/6831 |

FOREIGN PATENT DOCUMENTS

| | | | |
|---|---|---|---|
| JP | 2008304093 | A | 12/2008 |
| JP | 2009543320 | A | 12/2009 |
| JP | 5313384 | B2 | 10/2013 |
| KR | 1019970016424 | A | 4/1997 |
| KR | 1019990008915 | A | 2/1999 |
| KR | 1020120120048 | A | 11/2012 |
| KR | 101720752 | B1 | 4/2017 |

OTHER PUBLICATIONS

International Search Report issued in Intl. Appln. No. PCT/JP2018/043987 mailed Feb. 19, 2019. English translation provided.
Written Opinion issued in Intl. Appln. No. PCT/JP2018/043987 mailed Feb. 19, 2019.
Office Action issued in Korean Appln. No. 10-2020-7020305 mailed on Feb. 25, 2022.

* cited by examiner

F I G. 3
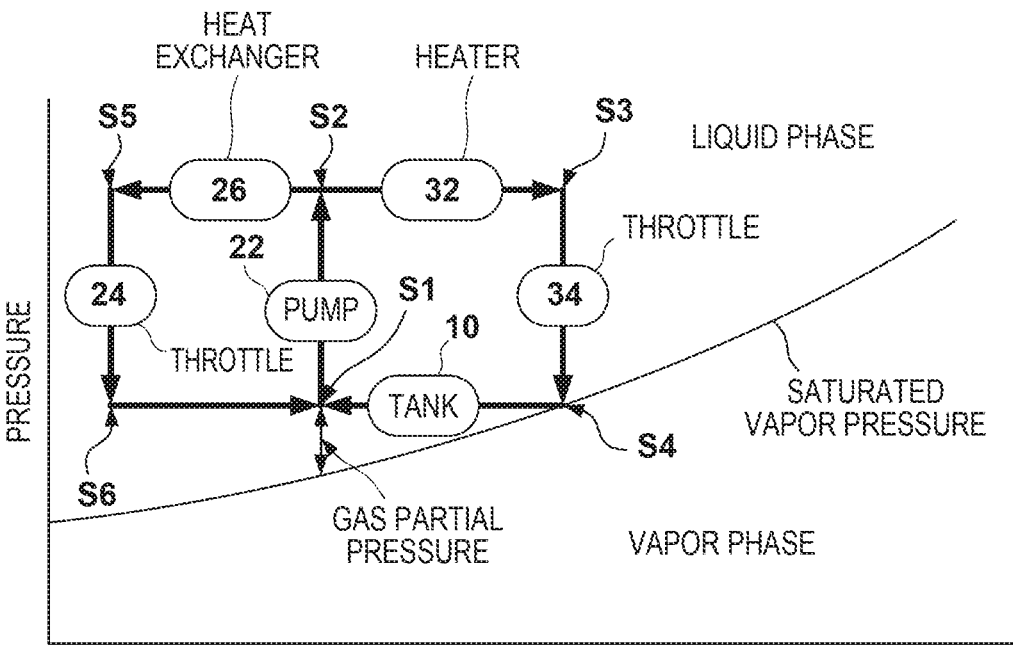

F I G. 6
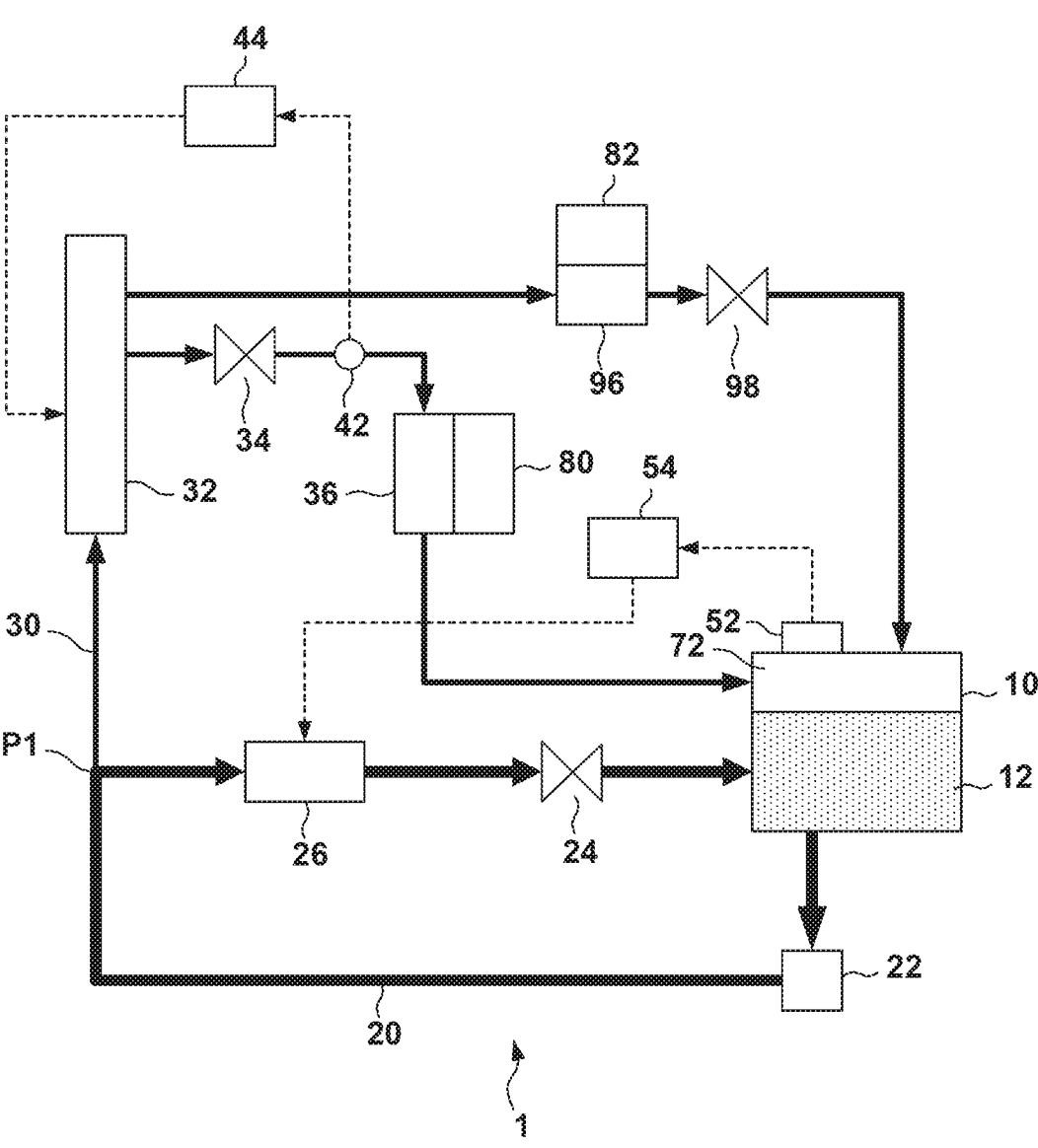

F I G. 9
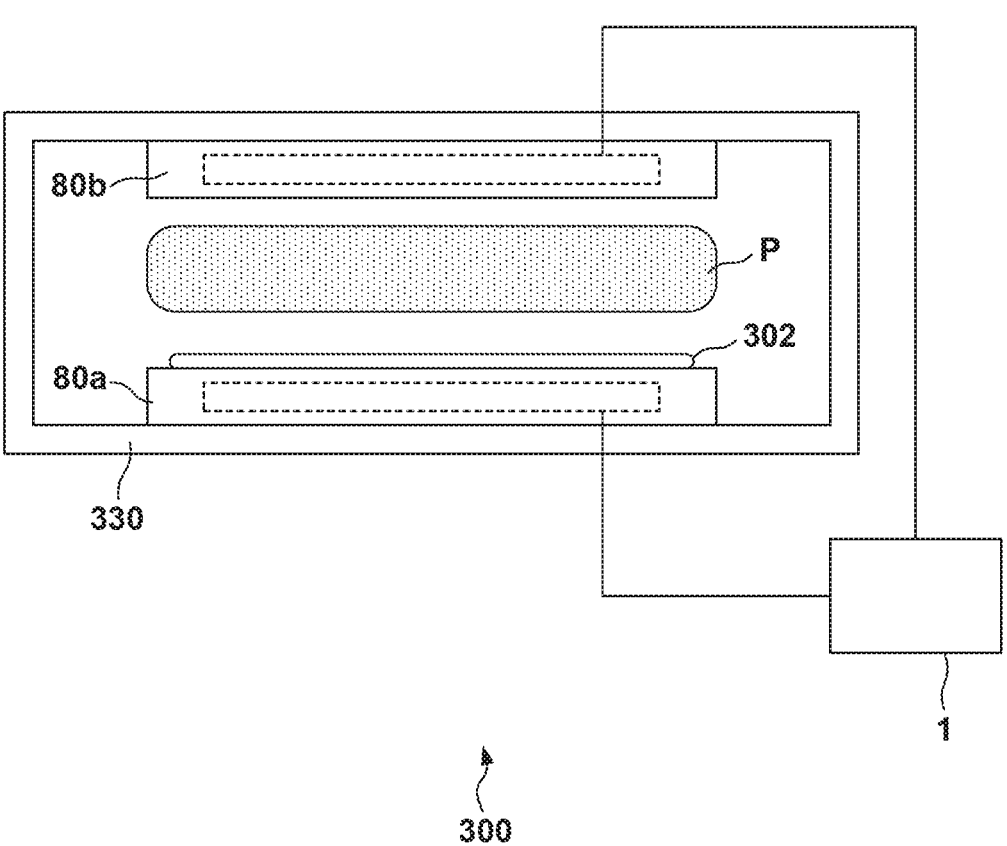

COOLING DEVICE, SEMICONDUCTOR MANUFACTURING APPARATUS, AND SEMICONDUCTOR MANUFACTURING METHOD

CROSS-REFERENCE TO RELATED APPLICATIONS

This application is a Continuation of International Patent Application No. PCT/JP2018/043987, filed Nov. 29, 2018, which claims the benefit of Japanese Patent Application No. 2017-250107, filed Dec. 26, 2017, both of which are hereby incorporated by reference herein in their entirety.

BACKGROUND OF THE INVENTION

Field of the Invention

The present invention relates to a cooling device, a semiconductor manufacturing apparatus, and a semiconductor manufacturing method.

Background Art

A semiconductor manufacturing apparatus such as a pattern formation apparatus such as an exposure apparatus, an imprint apparatus, or an electronic beam lithography apparatus or a plasma processing apparatus such as a CVD apparatus, an etching apparatus, or a sputtering apparatus can include a driving mechanism or a heat generating portion such as a member that is heated by plasma. To cool the heat generating portion, the semiconductor manufacturing apparatus can include a cooling device. The cooling device cools the heat generating portion by depriving heat from the heat generating portion and moving the heat.

Japanese Patent No. 5313384 discloses a cooling system including an evaporator that extracts heat from a component, a condenser, a pump, an accumulator, a heat exchanger, and a temperature sensor. A circuit is constituted to return a fluid from the pump via the evaporator and the condenser to the pump. The accumulator communicates the fluid to the circuit. The heat exchanger transfers heat from the fluid in the accumulator and transfers heat to the fluid in the accumulator. The amount of heat is controlled based on an output from the temperature sensor.

In the cooling system disclosed in Japanese Patent No. 5313384, the circuit is constituted to return a fluid from the pump via the evaporator and the condenser to the pump. To stably circulate the fluid, it is necessary to avoid cavitation at a pump suction portion. A cooler is therefore added to the condenser or on its downstream or upstream side to decrease the fluid temperature at the pump suction portion or increase the pressure. Since the fluid is pressurized at the outlet of the pump, the fluid is sent to the heat generating portion in a state in which it tends not to vaporize. At the heat generating portion, evaporative cooling is not done until the temperature of the fluid rises to the boiling point under the fluid pressure of the heat generating portion. Till evaporative cooling, temperature fluctuations of the heat generating portion are allowed, and members around the heat generating portion may deform owing to thermal expansion. To suppress the temperature fluctuations, the boiling point is controlled by changing the vapor-liquid equilibrium of the fluid by heat amount control to the accumulator and changing the pressure of the whole system so that the downstream side of the heat generating portion achieves a predetermined temperature using a vapor-liquid two-phase fluid accumulator. At the time of heat generation, heat is recovered from the accumulator to condense the fluid and decrease the pressure of the circulation system. However, the pressure of the pump suction portion also drops and the risk of cavitation rises. If no heat is generated, heat is supplied to the accumulator to vaporize the fluid and increase the pressure of the circulation system and the boiling point. However, to make the heat balance of the circulation system, it is necessary to perform cooling heat amount control of the fluid by the condenser or the cooler, or separately provide a heating means and perform heat generation amount control. This may complicate the arrangement and the control method.

SUMMARY OF THE INVENTION

One aspect of the present invention provides a cooling device having a simple arrangement.

One aspect of the present invention relates to a cooling device comprising a tank, a first path configured to circulate a liquid-phase refrigerant by a pump so as to extract the liquid-phase refrigerant from the tank, cool the liquid-phase refrigerant, and return the liquid-phase refrigerant to the tank, and a second path branched from the first path, the second path including a heater configured to heat the liquid-phase refrigerant supplied from the first path, a throttle configured to decrease a pressure of the refrigerant heated by the heater, and a vaporizer configured to vaporize, by heat from a cooling target, at least part of the refrigerant having passed through the throttle, and the refrigerant having passed through the throttle being returned to the tank.

Further features of the present invention will become apparent from the following description of exemplary embodiments with reference to the attached drawings.

BRIEF DESCRIPTION OF THE DRAWINGS

FIG. 3 is a graph exemplifying the heat cycle of a refrigerant in the cooling device according to the second embodiment of the present invention.

FIG. 6 is a view showing the arrangement of a cooling device according to the fifth embodiment of the present invention.

FIG. 9 is a view showing the arrangement of a semiconductor manufacturing apparatus according to an embodiment of the present invention.

DESCRIPTION OF THE EMBODIMENTS

The present invention will now be described through its exemplary embodiments with reference to the accompanying drawings.

Figure 1:
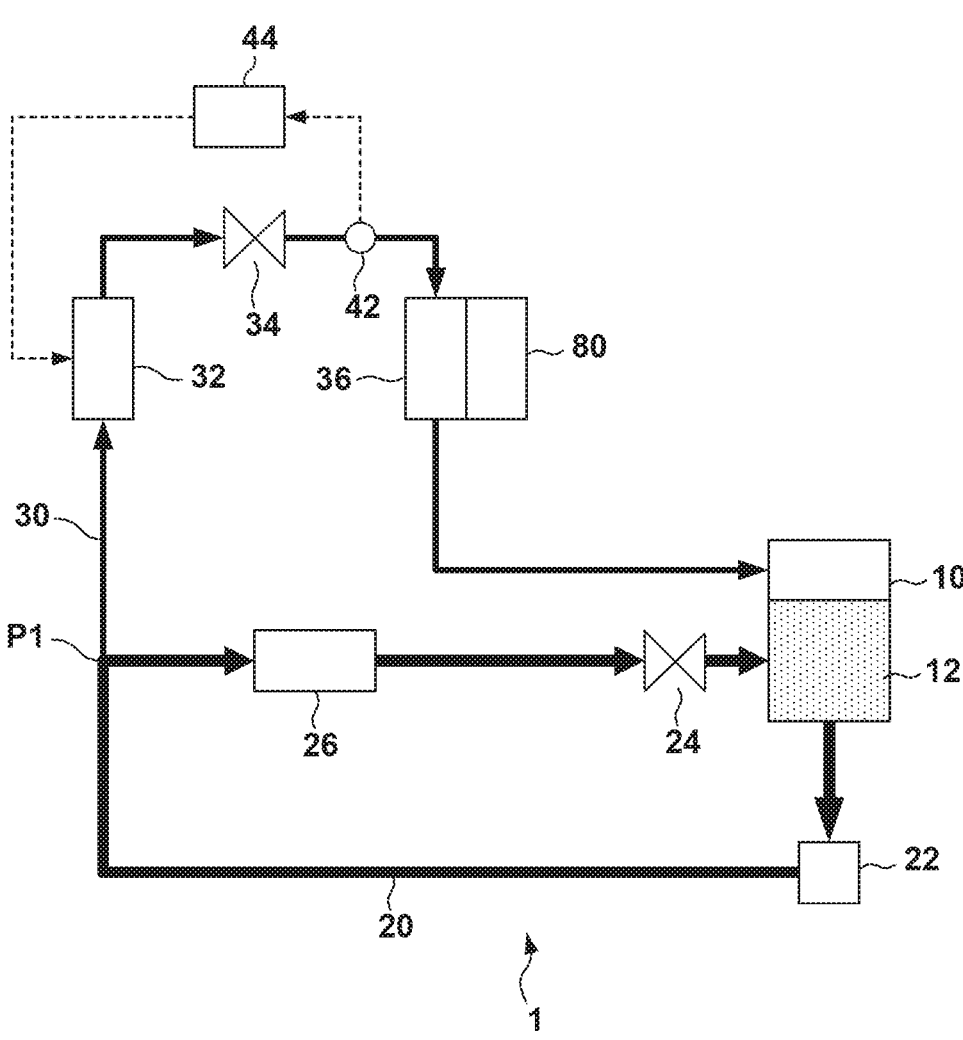
FIG. 1 is a view showing the arrangement of a cooling device according to the first embodiment of the present invention.

FIG. 1 shows the arrangement of a cooling device 1 according to the first embodiment of the present invention. A cooling target by the cooling device 1 is not limited to a special one and can be, for example, a semiconductor manufacturing apparatus and especially the heat generating portion of the semiconductor manufacturing apparatus. The semiconductor manufacturing apparatus can be a pattern formation apparatus such as an exposure apparatus, an imprint apparatus, or an electronic beam lithography apparatus, or a plasma processing apparatus such as a CVD apparatus, an etching apparatus, or a sputtering apparatus. The pattern formation apparatus includes a driving mechanism that quickly moves a component such as a substrate and/or an original. The driving mechanism generates heat along with driving of an article and can become a heat generating portion. In the plasma processing apparatus, a component such as an electrode is heated by plasma and the component can become a heat generating portion.

The cooling device 1 can be configured to cool a cooling target 80 such as a heat generating portion. The cooling device 1 can include a tank 10, a first path 20 through which a liquid-phase refrigerant 12 is circulated by a pump 22 so that the liquid-phase refrigerant 12 is extracted from the tank 10, cooled by a heat exchanger 26, and returned to the tank 10, and a second path 30 branched from the first path 20.

A branch point P1 of the second path 30 from the first path 20 can be arranged between the pump 22 and the heat exchanger 26. The first path 20 can include a first throttle 24 arranged between the heat exchanger 26 and the tank 10. The first throttle 24 can decrease the pressure of the liquid-phase refrigerant 12. The first throttle 24 may be arranged between the heat exchanger 26 and the branch point P1 of the second path 30 branched from the first path 20.

The refrigerant 12 can be circulated in the liquid phase through the first path 20. Hence, there is no need to consider damage to the pump by cavitation as in a system in which the liquid phase and the vapor phase coexist. According to the first embodiment, a condenser for changing the vapor-phase refrigerant 12 into the liquid-phase one need not be provided on the first path 20, and the cooling device 1 having a simple arrangement can be implemented. In the design of the first path 20, the specifications of the pump 22 and the like can be decided to prevent the generation of cavitation in transfer of the liquid-phase refrigerant 12. For example, at the suction portion of the pump 22 where cavitation occurs most readily, the selection of the pump 22 and the flow rate and pressure loss of the circulation path are decided so that the pressure of the refrigerant 12 becomes higher than the sum of the saturated vapor pressure of the refrigerant 12 at the temperature of the suction portion and NPSH (Net Positive Suction Head) unique to the pump 22.

The second path 30 can include, for example, a heater 32, a throttle (second throttle) 34, and a vaporizer 36, and can be configured to return to the tank 10 a refrigerant having passed through the vaporizer 36. The heater 32 heats the liquid-phase refrigerant 12 supplied from the first path 20 to a predetermined temperature. The throttle 32 decreases, to almost the saturated vapor pressure at the predetermined temperature, the pressure of the refrigerant 12 heated to the predetermined temperature by the heater 32 so that the refrigerant 12 readily boils. The vaporizer 36 boils and vaporizes, by heat from the cooling target 80, at least part of the refrigerant 12 having passed through the throttle 34. The refrigerant 12 in the vapor-liquid two-phase mixed state having passed through the vaporizer 36 can be returned to the tank 10, cooled by mixing the liquid-phase refrigerant 12 cooled through the first path 20, and changed from the vapor phase to the liquid phase (that is, can be condensed). The cooling device 1 can further include a temperature detector 42 that detects the temperature of the refrigerant 12 having passed through the throttle 34, and a temperature controller 44 that controls the heater 32 based on an output from the temperature detector 42. The refrigerant 12 set at a target temperature can be supplied to the vaporizer 36.

Figure 2:
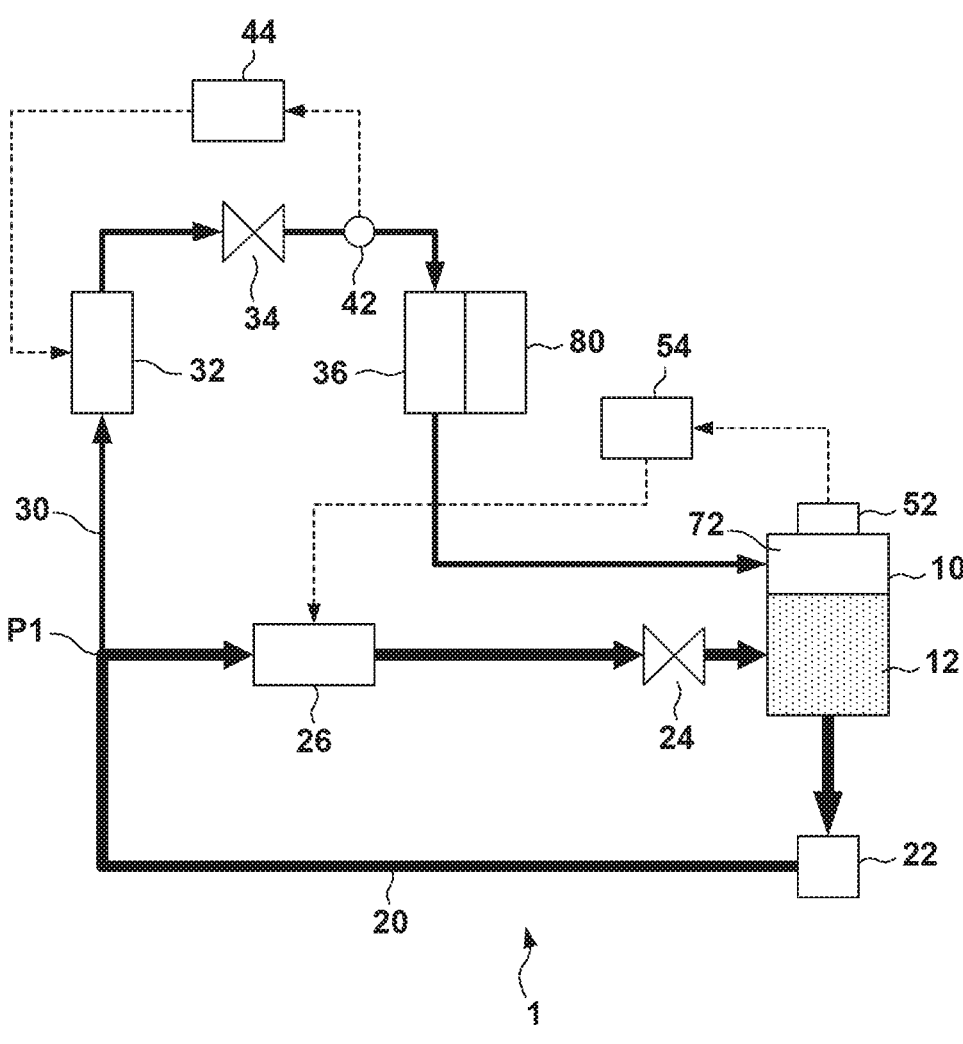
FIG. 2 is a view showing the arrangement of a cooling device according to the second embodiment of the present invention.

According to the first embodiment, the cooling device 1 limits the phase change of the refrigerant 12 at two portions, that is, the vaporizer 36 and the tank 10, and condenses the liquid-phase refrigerant 12 by mixing the different-temperature refrigerant 12. Only the heat exchanger 26 suffices as a means for discharging heat recovered by the cooling device 1 outside the system. The cooling device 1 having a simple arrangement can be implemented, FIG. 2 shows the arrangement of a cooling device 1 according to the second embodiment. The cooling device 1 according to the second embodiment is an improvement of the cooling device 1 according to the first embodiment, and the first embodiment can apply to matters which will not be mentioned in the second embodiment. The cooling device 1 according to the second embodiment can additionally include a detector 52 that detects the amount of a vaporized refrigerant 12 in a tank 10, and a controller 54 that controls (heat exchange in) a heat exchanger 26 based on an output from the detector 52. The amount of the vaporized refrigerant 12 in the tank 10 depends on the internal pressure of the tank 10. The detector 52 can detect the amount of the vaporized refrigerant 12 in the tank 10 by detecting the internal pressure of the tank 10. The amount of the vaporized refrigerant 12 in the tank 10 (in other words, the internal pressure of the tank 10) also depends on the temperature of the liquid-phase refrigerant 12 in the tank 10. The controller 54 controls (heat exchange in) the heat exchanger 26 based on an output from the detector 52. As a result, the temperature of the liquid-phase refrigerant 12 circulating through a first path 20 can be controlled and the condensation amount of the vaporized refrigerant 12 can be further controlled.

To control the condensation amount of the refrigerant 12, the vapor-phase refrigerant 12 needs to always exist in the tank 10. To implement this, a gas 72 that does not condense at the temperature of the tank 10 can be sealed in the tank 10. The gas 72 is one that does not react with the refrigerant 12.

FIG. 3 is a phase diagram of the refrigerant 12 in the cooling device 1. FIG. 3 exemplifies a saturated vapor pressure line and a heat cycle. The refrigerant 12 is in the liquid phase above the saturated vapor pressure line and in the vapor phase below the saturated vapor pressure line. On the first path 20, the liquid-phase refrigerant 12 is sucked from the tank 10 by a pump 22, pressurized into a state S2, cooled by the heat exchanger 26 into a state S5, depressurized by a throttle 24 into a state S6, and returned to the tank 10.

On a second path 30 the refrigerant 12 in the state S2 is heated by a heater 32 into a state S3, depressurized by a throttle 34 into a state S4, and returned to the tank 10 through a vaporizer 36. The gas 72 of a predetermined amount is sealed in the tank 10 so as to apply a partial pressure ("gas partial pressure") equivalent to the difference between the vapor pressure of the refrigerant 12 returned to the tank 10 and the vapor pressure of the (temperature-controlled) liquid-phase refrigerant 12 in the tank 10. The refrigerant 12 returned to the tank 10 through the second path 30 can exist as a gas corresponding to a saturated vapor pressure at the temperature in the state S1. If there is no partial pressure by the gas 72, the refrigerant 12 takes the state above the saturated vapor pressure line, that is, the liquid-phase state in the state S1. Setting the partial pressure of the gas 72 to be equal to or higher the NPSH of the pump 22 is equivalent to preventing the generation of cavitation. The partial pressure of the gas 72 can be equal to or higher than the NPSH of the pump 22.

If a cooling target 80 generates heat, the refrigerant 12 is vaporized by the vaporizer 36 on the second path 30, absorbs heat as latent heat, and returns to the tank 10, increasing the internal pressure of the tank 10. The detector 52 detects the increase, and the controller 54 controls the temperature of the refrigerant 12 on the first path 20 to decrease so that the pressure of the tank 10 always becomes a predetermined pressure, that is, the saturated vapor pressure of the refrigerant 12 at the temperature in the state S4. To the contrary, if the heat generation of the cooling target 80 stops, the refrigerant 12 is not vaporized by the vaporizer 36 on the second path 30 and the internal pressure of the tank 10 drops. The detector 52 detects the increase, and the controller 54 controls the temperature of the refrigerant 12 on the first path 20 to increase so that the pressure of the tank 10 always becomes a predetermined pressure, that is, the saturated vapor pressure of the refrigerant 12 at the temperature in the state S4.

In accordance with the beat generation state of the cooling target 80, heat can be recovered from the cooling target 80 by the latent heat of vaporization of the refrigerant 12 at a predetermined temperature in the state S4, and can be discharged outside the system by the heat exchanger 26. The diameter of a tube between the vaporizer 26 and the tank 10 through which the refrigerant 12 on the second path becomes a vapor-liquid two-phase flow is preferably increased to minimize the pressure loss and decrease the differential pressure between the vaporizer 26 and the tank 10. This can suppress temperature fluctuations caused by a change of the heat generation amount of the cooling target 80.

Figure 4:
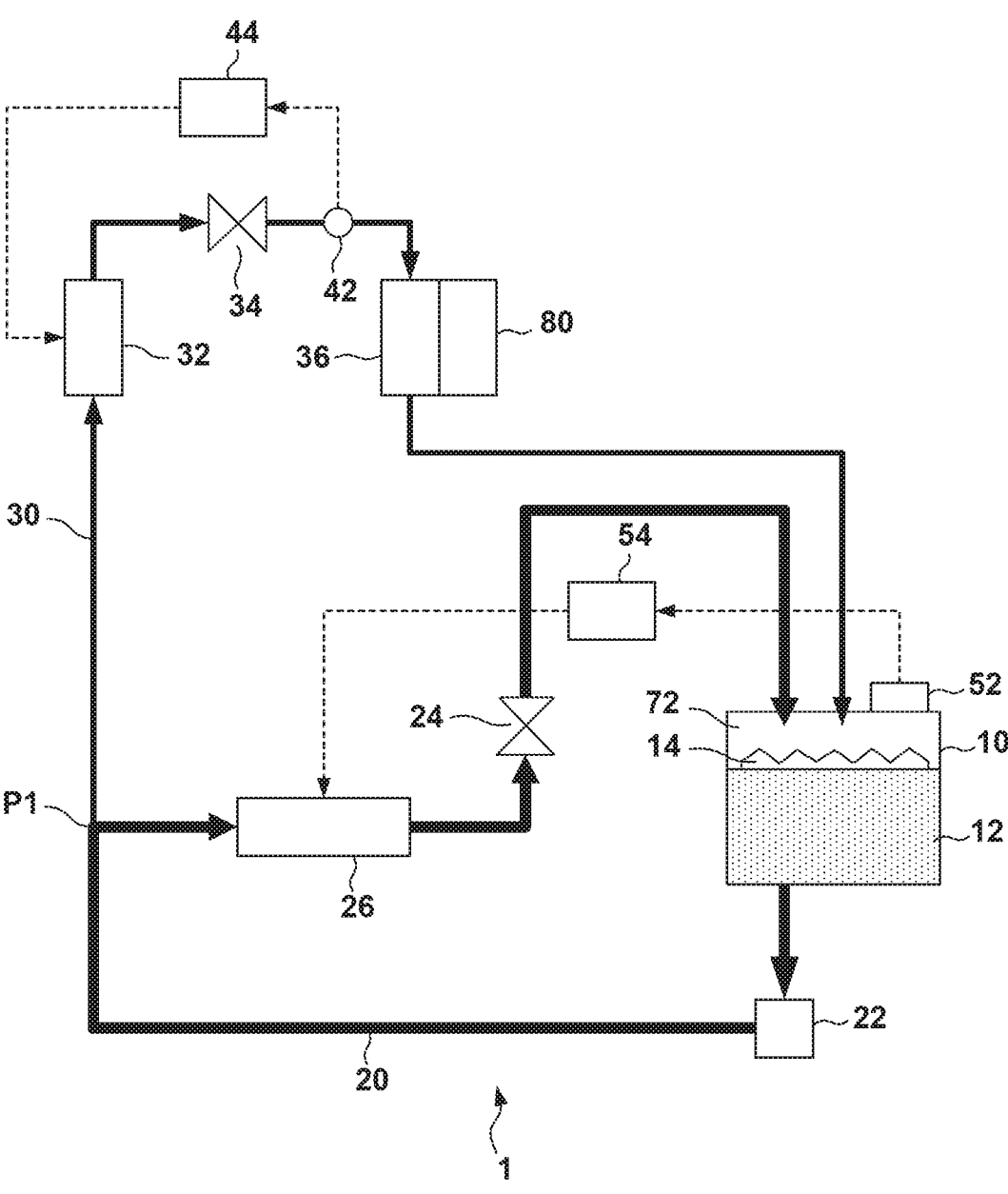
FIG. 4 is a view showing the arrangement of a cooling device according to the third embodiment of the present invention.

FIG. 4 shows the arrangement of a cooling device 1 according to the third embodiment. The cooling device 1 according to the third embodiment is an improvement of the cooling device 1 according to the second embodiment, and the first and second embodiments can apply to matters which will not be mentioned in the third embodiment. In the cooling device 1 according to the third embodiment, a tank 10 includes a member 14 having a sectional area larger than a horizontal sectional area in the tank 10. The member 14 can be arranged to contact a liquid-phase refrigerant 12 in the tank 10 and the refrigerant 12 returned from a second path 30. The member 14 can be, for example, a member having an uneven surface, a mesh member, a member having a plurality of holes, or a porous member. The liquid-phase refrigerant 12 returned from a first path 20 to the tank 10 can be returned to the tank 10 so as to drop from the member 14. Alternatively, the liquid-phase refrigerant 12 returned from the first path 20 to the tank 10 may be dropped or sprayed as a shower or a mist from above the tank 10.

Hence, the contact area between the low-temperature, liquid-phase refrigerant 12 cooled by a heat exchanger 26 on the first path 20 and the high-temperature refrigerant 12 returned from the second path 30 is increased. The efficiency of condensing the high-temperature refrigerant 12 returned from the second path 30 can be improved.

Figure 5:
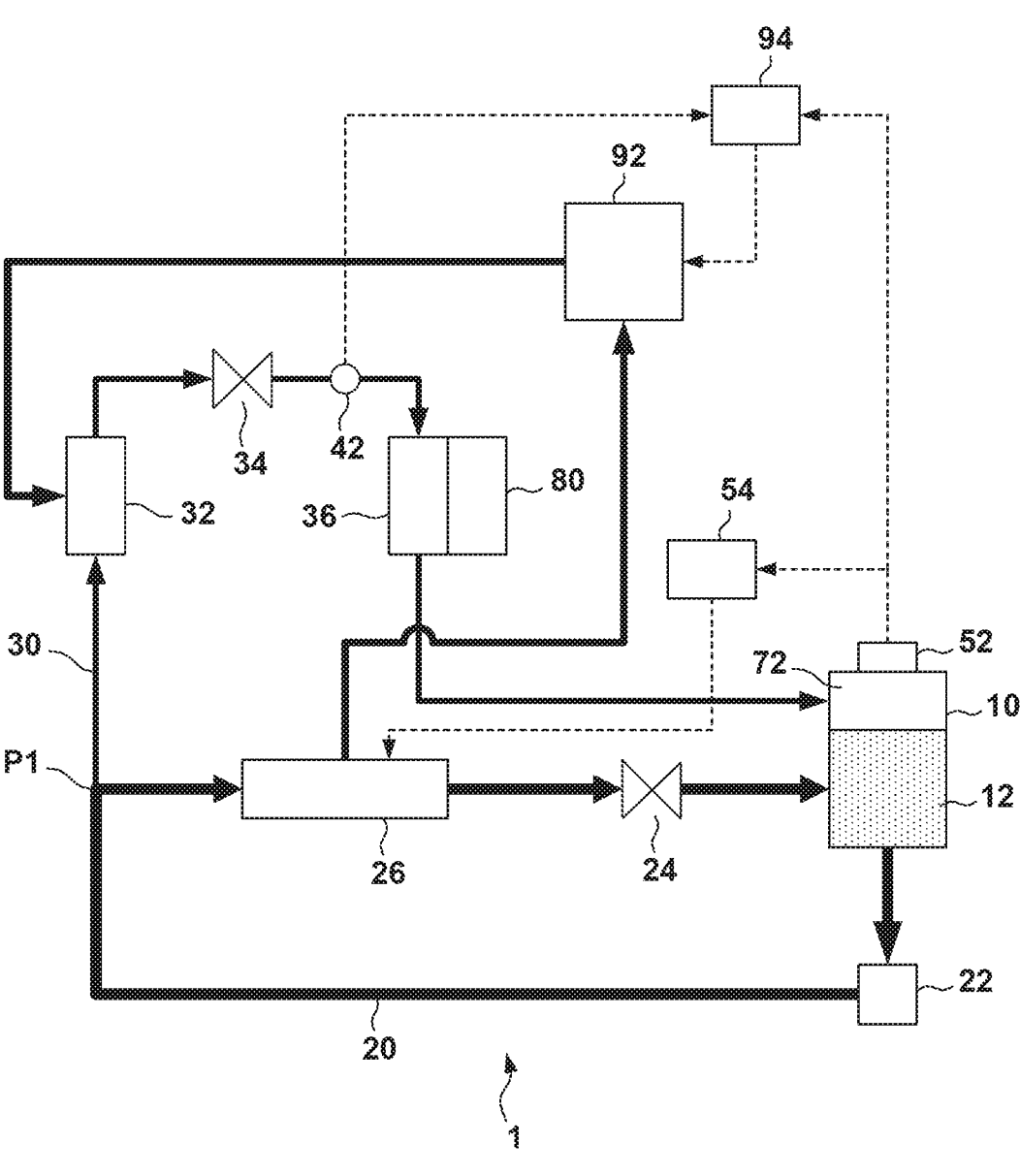
FIG. 5 is a view showing the arrangement of a cooling device according to the fourth embodiment of the present invention.

FIG. 5 shows the arrangement of a cooling device 1 according to the fourth embodiment. The cooling device 1 according to the fourth embodiment is an improvement of the cooling device 1 according to each of the first to third embodiments, and the first to third embodiments can apply to matters which will not be mentioned in the fourth embodiment.

The cooling device 1 according to the fourth embodiment can further include a heat pump 92 that moves, to a heater 32 provided on a second path 30, heat discharged from a heat exchanger 26 provided on a first path 20. The heater 32 can be configured to heat a liquid-phase refrigerant 12 supplied to the second path 30 branched from the first path 20 by using heat provided from the heat pump 92. The heat pump 92 can be controlled based on, for example, an output from a temperature detector 42. Alternatively, the heat pump 92 can be controlled based on an output from the temperature detector 42 and an output from a detector 52.

According to the fourth embodiment, the energy consumption can be reduced by heating the refrigerant 12 by the heater 32 on the second path 30 using heat discharged by the heat exchanger 26 on the first path 20.

FIG. 6 shows the arrangement of a cooling device 1 according to the fifth embodiment. The cooling device 1 according to the fifth embodiment is an improvement of the cooling device 1 according to each of the first to fourth embodiments, and the first to fourth embodiments can apply to matters which will not be mentioned in the fifth embodiment. The cooling device 1 according to the fifth embodiment further includes a second heat exchanger 96 that performs heat exchange between a refrigerant 12 heated by a heater 32 and a second cooling target 82. The refrigerant 12 having passed through the second heat exchanger 96 can be returned to a tank 10. A throttle 98 can be arranged on a path between the second heat exchanger 96 and the tank 10. It is preferable not to arrange a throttle between the heater 32 and the second cooling target 82. This is because heat can be recovered from the second cooling target 82 without no phase change of the refrigerant 12, by supplying the high-pressure refrigerant 12 to the second cooling target 82. Accordingly, microvibrations generated at the time of phase change of the refrigerant 12 are hardly transferred to the second cooling target 82.

The cooling device 1 according to the fifth embodiment is useful for, for example, cooling a cooling target (first cooling target) 80 relatively large in heat generation amount and relatively high in allowance for vibrations, and the second cooling target 82 relatively small in heat generation amount and relatively low in allowance for vibrations. An apparatus having the first cooling target 80 and the second cooling target 82 is, for example, a positioning apparatus (stage apparatus) including a coarse driving mechanism and a fine driving mechanism. The coarse driving mechanism coarsely drives the fine driving mechanism, and the fine driving mechanism finely drives a positioning target (for example, a substrate or a substrate stage). The actuator of the coarse driving mechanism can be the first cooling target 80. The actuator of the fine driving mechanism can be the second cooling target 82.

Figure 7:
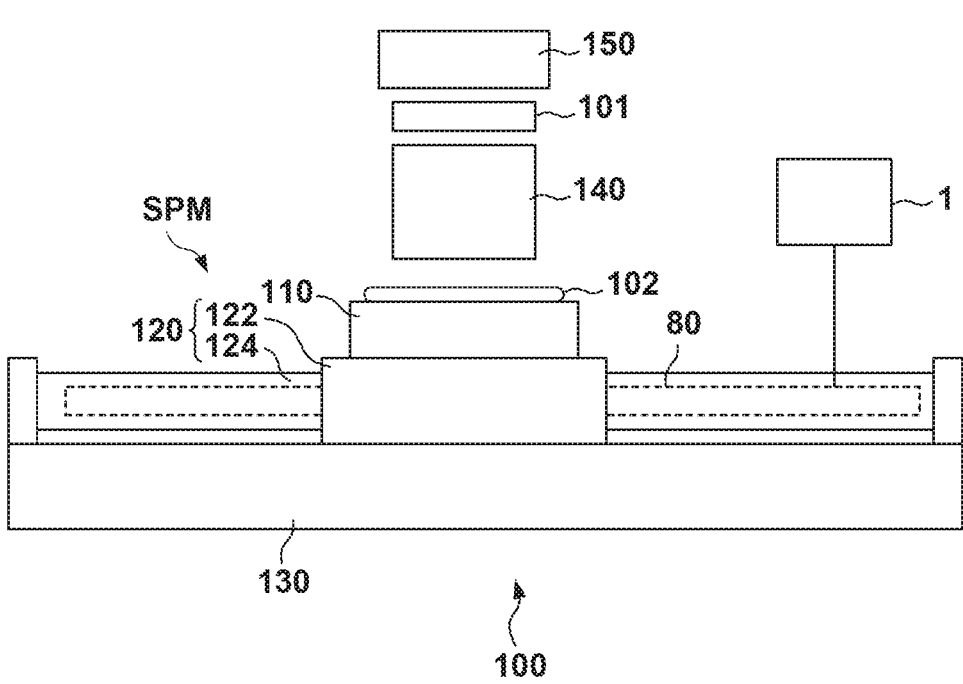
FIG. 7 is a view showing the arrangement of a semiconductor manufacturing apparatus according to an embodiment of the present invention.

A semiconductor manufacturing apparatus to which the cooling device 1 is applied will be exemplarily explained with reference to FIGS. 7, 8, and 9. FIG. 7 schematically shows the arrangement of an exposure apparatus 100 as an example of a semiconductor manufacturing apparatus, more specifically, a pattern formation apparatus. The exposure apparatus 100 can be configured to transfer the pattern of an original 101 through a projection optical system 140 to a photosensitive layer of a substrate 102 having the photosensitive layer. The exposure apparatus 100 can include an illumination optical system 150 that illuminates the original 101, the projection optical system 140, and a substrate positioning mechanism SPM. The exposure apparatus 100 can also include an original positioning mechanism (not shown) that positions the original 101. The substrate positioning mechanism SPM can include a substrate stage 110 having a substrate chuck that holds the substrate 102, a driving mechanism 120 that drives the substrate stage 110, and a base member 130 that supports the driving mechanism 120. The driving mechanism 120 can include an actuator including a mover 122 that moves together with the substrate stage 110, and a stator 124 fixed to the base member 130. The stator 124 can include a coil line as the cooling target 80. The cooling device 1 can be configured to cool the coil line serving as the cooling target 80.

Figure 8:
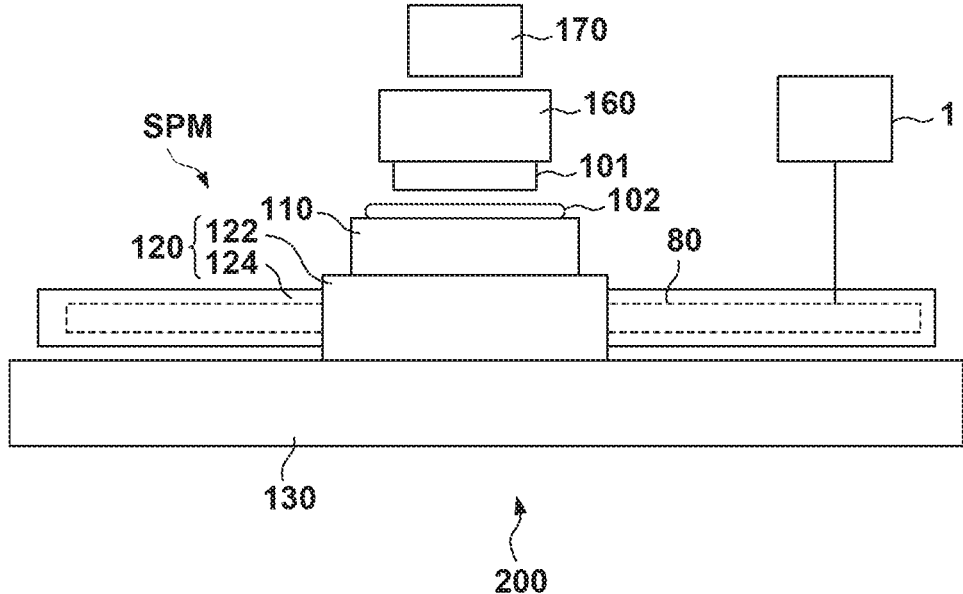
FIG. 8 is a view showing the arrangement of a semiconductor manufacturing apparatus according to an embodiment of the present invention.

FIG. 8 schematically shows the arrangement of an imprint apparatus 200 as an example of a semiconductor manufacturing apparatus, more specifically, a pattern formation apparatus. The imprint apparatus 200 can be configured to transfer the pattern of an original 101 to an imprint material on a substrate 102. The imprint apparatus 200 can include an original driving mechanism 160 that drives the original 101, a substrate positioning mechanism SPM that drives the substrate 102, and a curing unit 170 that cures the imprint material on the substrate 102.

At least one of the original driving mechanism 160 and the substrate positioning mechanism SPM can align a shot region of the substrate 102 and a pattern region of the original 101. At least one of the original driving mechanism 160 and the substrate positioning mechanism SPM can bring an imprint material on the substrate 102 and a pattern region of the original 101 into contact with each other, and separate the imprint material and the pattern region. While the imprint material on the substrate 102 and the pattern region of the original 101 are in contact with each other, the curing unit 170 cures the imprint material. After that, the cured imprint material and the pattern region of the original 101 are separated. As a result, the pattern made of the cured imprint material is formed on the substrate 102. That is, the pattern region of the original 101 is transferred to the imprint material on the substrate 102.

The substrate positioning mechanism SPM can include a substrate stage 110 having a substrate chuck that holds the substrate 102, a driving mechanism 120 that drives the substrate stage 110, and a base member 130 that supports the driving mechanism 120. The driving mechanism 120 can include an actuator including a mover 122 that moves together with the substrate stage 110, and a stator 124 fixed to the base member 130. The stator 124 can include a coil line as the cooling target 80. The cooling device 1 can be configured to cool the coil line serving as the cooling target 80.

FIG. 9 schematically shows the arrangement of a plasma processing apparatus 300 as an example of a semiconductor manufacturing apparatus. The plasma processing apparatus 300 can be, for example, a CVD apparatus, an etching apparatus, or a sputtering apparatus. The plasma processing apparatus 300 can include a chamber 330, and an electrode structure serving as one or a plurality of cooling targets 80a and 80b arranged in the chamber 330. In the example of FIG. 9, a substrate 302 can be supported by the cooling target 80a. A gas for generating plasma can be supplied into the chamber 330. When the plasma processing apparatus 300 is constituted as a CVD apparatus, a deposition gas can be supplied into the chamber 330. When the plasma processing apparatus 300 is constituted as an etching apparatus, an etching gas can be supplied into the chamber 330. When the plasma processing apparatus 300 is constituted as a sputtering apparatus, a gas for generating plasma can be supplied into the chamber 330. A target can be attached to the electrode structure serving as the cooling target 80b. The cooling device 1 can be configured to cool the cooling targets 80a and 80b.

A semiconductor manufacturing method as one aspect of the present invention can include a step of processing a substrate by a semiconductor manufacturing apparatus typified by the above-described exposure apparatus 100, imprint apparatus 200, and plasma processing apparatus 300, and a step of treating the substrate processed in the step. The step of processing a substrate by a semiconductor manufacturing apparatus can be, for example, a step of forming a pattern on a substrate, a step of forming a film on the substrate, or a step of etching the substrate or the film formed on it. The step of treating the substrate can be, for example, a step of forming a pattern on the substrate, a step of forming a film on the substrate, or a step of etching the substrate or the film formed on it. Alternatively, the step of treating the substrate can be a step of dividing (dicing) the substrate or a step of sealing the substrate.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors ((e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A cooling device for use in semiconductor manufacturing, a tank;

a first path including a pump and a heat exchanger, wherein a liquid-phase refrigerant is circulated through the first path by the pump so that the liquid-phase refrigerant is extracted from the tank and returned to the tank, the heat exchanger cooling the liquid-phase refrigerant in the first path;

a second path branched from the first path;

a detector configured to detect an internal pressure of the tank; and a controller configured to control the heat exchanger based on an output from the detector, wherein the second path includes a heater configured to heat the liquid-phase refrigerant supplied from the first path, a throttle configured to decrease a pressure of the refrigerant heated by the heater such that the pressure of the refrigerant approaches a saturated vapor pressure of the refrigerant, and a vaporizer configured to vaporize, by heat from a cooling target, at least part of the refrigerant having passed through the throttle, and the refrigerant having passed through the throttle being returned to the tank, wherein a gas does not condense in the tank, wherein a partial pressure of the gas in the tank is higher than a difference between a vapor pressure of the refrigerant returned to the tank and a vapor pressure of the refrigerant in the tank, wherein the tank includes a member, disposed within, and separate from, walls of the tank, having a sectional area larger than a horizontal sectional area in the tank, and wherein the member is arranged to contact a liquid-phase refrigerant in the tank and the refrigerant returned from the second path.

2. The cooling device according to claim 1, further comprising:

a temperature detector configured to detect a temperature of the refrigerant having passed through the throttle; and a temperature controller configured to control the heater based on an output from the temperature detector.

3. The cooling device according to claim 2, wherein the temperature detector is arranged between the throttle and the vaporizer, and configured to detect the temperature of the refrigerant the pressure of which is decreased by the throttle, and wherein the temperature controller is configured to control the heater such that the refrigerant the temperature of which is set to a target temperature enters the vaporizer.

4. The cooling device according to claim 1, wherein a branch point of the second path from the first path is arranged between the pump and the heat exchanger.

5. The cooling device according to claim 4, wherein the first path further includes a first throttle arranged between the branch point of the second path and the tank.

6. The cooling device according to claim 1, wherein a partial pressure of the gas is not lower than NPSH (Net Positive Suction Head) of the pump.

7. The cooling device according to claim 1, further comprising a heat pump configured to move heat discharged from the heat exchanger to the heater, wherein the heater is configured to heat a liquid-phase refrigerant supplied from the first path by using heat provided from the heat pump.

8. The cooling device according to claim 7, wherein the heat pump is controlled based on an output from the temperature detector.

9. The cooling device according to claim 1, further comprising a heat pump configured to move heat discharged from the heat exchanger to the heater, wherein the heater is configured to heat a liquid-phase refrigerant supplied from the first path by using heat provided from the heat pump, and the heat pump is controlled based on an output from the temperature detector and an output from the detector.

10. The cooling device according to claim 1, wherein the refrigerant returned from the first path to the tank is returned to the tank so as to drop from above the member.

11. The cooling device according to claim 1, wherein the refrigerant returned from the first path to the tank is dropped or sprayed as a shower or a mist from above the tank.

12. The cooling device according to claim 1, further comprising a second heat exchanger configured to perform heat exchange between the refrigerant heated by the heater and a second cooling target.

13. The cooling device according to claim 12, wherein the refrigerant having passed through the second heat exchanger is returned to the tank.

14. The cooling device according to claim 13, further comprising a throttle arranged on a path between the second heat exchanger and the tank.

15. A semiconductor manufacturing apparatus including a heat generating portion, comprising a cooling device defined in claim 1, wherein the cooling device is configured to cool the heat generating portion serving as the cooling target.

16. The semiconductor manufacturing apparatus according to claim 15, wherein the semiconductor manufacturing apparatus is constituted as a pattern formation apparatus configured to form a pattern.

17. A semiconductor manufacturing method comprising:

a step of processing a substrate by a semiconductor manufacturing apparatus defined in claim 15; and a step of treating the substrate processed in the step.

18. The cooling device according to claim 1, wherein the throttle is configured to decrease the pressure of the refrigerant heated by the heater such that the refrigerant readily boils at the vaporizer.

* * * * *